United States Patent [19]

Fernandez et al.

[11] Patent Number: 5,479,129
[45] Date of Patent: Dec. 26, 1995

[54] VARIABLE PROPAGATION DELAY DIGITAL SIGNAL INVERTER

[75] Inventors: Francisco J. Fernandez, Fogelsville; Thayamkulangara R. Viswanathan, Albany Township, Berks County, both of Pa.

[73] Assignee: AT&T Corp., Murray Hill, N.J.

[21] Appl. No.: 158,126

[22] Filed: Nov. 24, 1993

[51] Int. Cl.$^6$ .......................... H03K 17/28; H03B 7/00; H03B 5/02

[52] U.S. Cl. .......................... 327/276; 327/402; 327/568; 331/57; 331/115; 331/132

[58] Field of Search .................... 307/603, 604, 307/590, 599, 540, 566, 274, 283, 322, 323, 324; 327/568, 569, 570, 571, 195, 192, 196, 568, 276, 402, 261, 397; 331/132, 115, 57

[56] References Cited

U.S. PATENT DOCUMENTS

| | | | |
|---|---|---|---|
| 3,234,403 | 2/1966 | Candy | 307/274 |
| 3,931,588 | 1/1976 | Gehweiler | 331/57 |
| 4,346,343 | 8/1982 | Berndlmaier | 323/282 |
| 4,384,300 | 5/1983 | Iizuka | 307/291 |
| 4,432,032 | 2/1984 | Baker et al. | 307/642 |
| 4,571,504 | 2/1986 | Iwamoto | 307/290 |
| 4,603,264 | 7/1986 | Nakano | 307/290 |
| 4,849,934 | 7/1989 | Yokoyama et al. | 307/322 |
| 4,988,960 | 1/1991 | Tomisawa | 332/127 |
| 5,012,141 | 4/1991 | Tomisawa | 307/594 |
| 5,012,142 | 4/1991 | Sonntag | 307/602 |
| 5,039,893 | 8/1991 | Tomisawa | 307/597 |
| 5,051,625 | 9/1991 | Ikeda et al. | 307/475 |
| 5,054,038 | 10/1991 | Hedberg | 375/118 |
| 5,072,197 | 12/1991 | Anderson | 331/57 |
| 5,075,569 | 12/1991 | Branson | 307/270 |
| 5,121,014 | 6/1992 | Huang | 307/605 |
| 5,192,886 | 3/1993 | Wetlaufer | 307/595 |
| 5,206,609 | 4/1993 | Mijuskovic | 331/57 |
| 5,220,216 | 6/1993 | Woo | 307/469 |
| 5,223,316 | 8/1993 | Yamada et al. | 331/45 |
| 5,416,446 | 5/1995 | Holler, Jr. et al. | 327/114 |

FOREIGN PATENT DOCUMENTS

| | | | |
|---|---|---|---|
| 1129524 | 5/1989 | Japan | H03K 5/13 |
| 227412 | 8/1990 | Japan | H03K 5/13 |

OTHER PUBLICATIONS

Holler, P. T. 1–2, Filed Dec. 8, 1992, Ser. No. 07/987,917; "A Digital Programmable Frequency Generator."

Leonowich, R. H. 7, Filed Feb. 25, 1993, Ser. No. 08/023,243; "Wide–range Variable Delay Line and Ring Oscillator."

*IEEE Journal of Solid–State Circuits*, vol. 27, No. 12, Dec. 1992, "A 155–MHz Clock Recovery Delay–and Phase–Locked Loop," Lee, T. H. et al., pp. 1736–1745.

Enam, S. K., et al, *IEEE Journal of Solid–State Circuits*, vol. 25, No. 1, Feb. 1990, "A 300–MHz CMOS Voltage–Controlled Ring Oscillator," pp. 312–315.

Young, I. A., et al.; *IEEE Journal of Solid State Circuits*, vol. 27, No. 11, Nov. 1992; "A PLL Clock Generator with 5 to 110 MHz of Lock Range for Microprocessors," pp. 1599–1608.

Fernald, K. W., et al.; ISSCC 92, "An Implantable Digital Telemetry Integrated Circuit Using An Automatic Resonant–Frequency Search Technique," Feb. 19, 1992, Paper WP 4.4.

DeVito, L., et al.; ISSC91/Session 8/Hard–Disk and Data–Communication IC's/Paper TP 8.6, "A 52 MHz and 155 MHz Clock–Recovery PLL," *1991 IEEE International Solid–State Circuits Conference*, pp. 142, 143, Mar. 1991.

Primary Examiner—Timothy P. Callahan
Assistant Examiner—Terry L. Englund
Attorney, Agent, or Firm—Howard A. Skaist

[57] ABSTRACT

An electronically-controlled variable propagation delay digital signal inverter comprises a digital signal inverter having an input signal port and an output signal port, and an electronically-controlled negative resistance (ECNR). The ECNR is coupled to the output port of the inverter in a configuration so as to render the propagation delay of the digital signal inverter capable of being varied by varying the resistance of the ECNR. The electronically-controlled variable propagation delay digital signal inverter may be included in a ring oscillator configuration.

23 Claims, 3 Drawing Sheets

5,479,129

VARIABLE PROPAGATION DELAY DIGITAL SIGNAL INVERTER

TECHNICAL FIELD

This invention relates to digital signal inverters, such as may be employed in delay lines and ring oscillators and, more particularly, to variable propagation delay digital signal inverters for use in such ring oscillators and delay lines.

BACKGROUND OF THE INVENTION

Delay lines are widely used in a variety of integrated circuit (IC) applications, such as delay or phase-locked loops (PLLs), clock generators, or frequency synthesizers. The delay line is typically formed on an IC by cascading a string of digital signal, or digital logic, inverters, each connection or coupling between the inverters serving as a "tap" along the delay line. One method of controlling the amount of delay through the delay line involves varying ("starving") the power supply current supplied to the digital signal inverters. Another technique involves varying the amount of capacitive loading at the output port of the inverters, such as illustrated in U.S. Pat. No. 5,012,142, assigned to the assignee of the present invention and herein incorporated by reference.

One drawback of the delay control approaches described above is the inability of the propagation delay in the delay line to be as short as the technology used to implement the delay line permits. For example, the delay for a current "starved" inverter based delay line may be significantly longer than if the inverters are not current limited. Further, if the current "starving" is accomplished by decreasing the power supply current, as the inverter is current "starved" to increase the delay, the voltage amplitude swing of signals propagating through the inverters may decrease, thus having the undesirable effect of actually reducing, rather than increasing, the propagation delay.

A ring oscillator may be formed from a delay line by coupling the input port of an active delay line to its output port. This technique, for example, is widely used in IC PLLs. Such ring oscillators typically have an odd number of digital signal inverters or inverting delay stages serially connected or coupled so as to form a ring oscillator configuration. The oscillation frequency is substantially determined by the propagation delay of the digital signal inverters.

The propagation delay for a digital signal inverter in the ring oscillator may be controlled by the techniques described above. Nonetheless, these approaches have several drawbacks, much like the drawbacks described above with respect to delay lines. First, the highest oscillation frequency of the ring oscillator may be considerably less than the oscillation frequencies possible with the technology used to implement the oscillator, such as CMOS technology. Second, these delay control approaches, in particular current "starving" the inverter, may exhibit uncontrolled signal amplitudes, possibly leading to a nonmonotonic frequency versus voltage characteristic and, likewise, degrading oscillator performance. Third, these delay techniques, such as current "starving" the inverters, frequently require narrowly controlled bias currents, often achieved by using a voltage-to-current signal converter, for satisfactory operation. Thus, a need exists for a digital signal inverter for use in ring oscillators and delay lines that reduces the foregoing problems.

SUMMARY OF THE INVENTION

Briefly, in accordance with one embodiment of the invention, an electronically-controlled variable propagation delay digital signal inverter comprises a digital signal inverter, having an input signal port and an output signal port, and an electronically-controlled negative resistance (ECNR). The ECNR is coupled to the output port of the inverter.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

DETAILED DESCRIPTION

Figure 1:
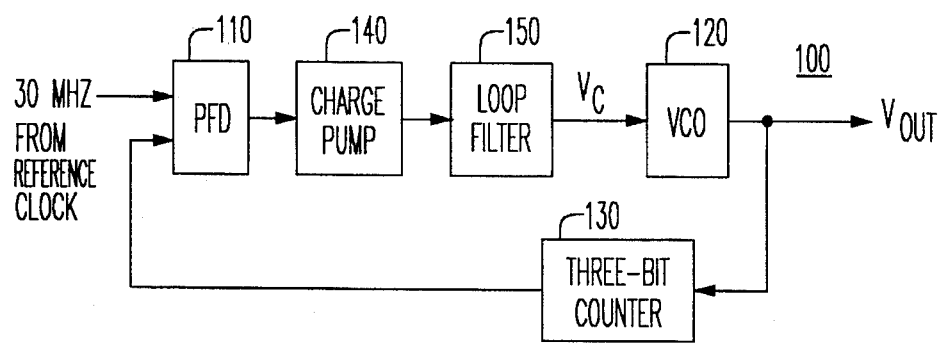
FIG. 1 is a block diagram of a frequency synthesizer, such as may employ an electronically-controlled variable frequency ring oscillator in accordance with the invention.

FIG. 1 is a block diagram illustrating a PLL frequency synthesizer, such as may incorporate an electronically-controlled variable frequency ring oscillator in accordance with one aspect of the invention. As illustrated in FIG. 1, a phase-frequency detector (PFD) 110 is responsive to an externally-derived 30 MHz oscillating signal, e.g., a reference clock square wave signal, provided, for example, by an external crystal (not shown). A counter output signal is applied to PFD 110 by a three-bit counter 130 for comparison with the externally-derived reference clock signal or clock pulse. $V_{out}$, an oscillating signal produced by voltage-controlled oscillator (VCO) 120, is applied to counter 130, which, in this particular embodiment, counts every eighth pulse of the oscillating signal, $V_{out}$, and thereby produces the counter output signal, oscillating at one-eighth the frequency of $V_{out}$. In response to the comparison between the counter output signal and the reference clock signal, PFD 110 controls the output signal provided by charge pump 140, whose output signal is filtered by loop filter 150, producing a voltage control signal, $V_c$. $V_c$ is applied to VCO 120 and affects the oscillation frequency of $V_{out}$. Thus, in this embodiment of a frequency synthesizer 100, VCO 120 provides a 240 MHz signal when the frequency synthesizer is in equilibrium. When $V_{out}$ achieves this signal frequency, counter 130 provides a 30 MHz signal to PFD 110 and control voltage $V_c$ is no longer adjusted to "tune" or modify the oscillation frequency of $V_{out}$. The invention, however, is not restricted in scope to these particular frequencies, which are provided only for the purposes of illustration.

In general, VCOs are known in the art. Examples include those described in: U.S. patent application Ser. No. 08/023,243, entitled "Wide-Range Variable Delay Line and Ring Oscillator," filed Feb. 25, 1993, and U.S. patent application Ser. No. 07/987,917, entitled "A Digital Programmable Frequency Generator," filed Dec. 8, 1992, both of the foregoing patent applications being assigned to the assignee of the current invention and being herein incorporated by reference. VCOs are also described in: "A PLL Clock Generator With 5 to 110 MHz of Lock Range for Microprocessors," by I. A. Young, J. K. Greason, and K. L. Wong, appearing in *IEEE Journal of Solid-State Circuits*, Volume 27, No. 11, November, 1992; "A 300 MHz CMOS Voltage-Controlled Ring Oscillator," by S. K. Enam and A. A. Abidi, appearing in *IEEE Journal of Solid-State Circuits*, Volume 25, No. 1, February, 1990; and "An Implantable Digital Telemetry Integrated Circuit Using an Automatic Resonant-Frequency Search Technique," by K. W. Fernald, J. J. Paulos, B. A. Stackhouse, and R. A. Heaton, appearing in the Fourth Signal Processing Session of ISSCC'92, held on Feb. 19, 1992, all of the foregoing herein incorporated by reference.

Nonetheless, conventional implementations of VCOs, particularly using ring oscillators, suffer from several disadvantages. One important disadvantage, as previously described, is that the highest oscillation frequency attained by such ring oscillators may be considerably less than the oscillation frequencies possible with the technology used to implement the oscillator, such as a ring oscillator implemented using conventional CMOS digital signal inverters. As previously described, typically ring oscillators comprise an odd number, or 2N+1, N being a positive integer, of cascaded, or serially coupled, digital signal inverters, the inverters being coupled together so as to form a ring-shaped signal path. However, in order for such a ring oscillator to be tunable or to otherwise control the frequency of the oscillator with an electrical or electronic signal, typically one or more electrical or electronic tunable components may be introduced between the digital signal inverters to provide the desired tunability.

FIG. 1 of aforementioned U.S. patent application Ser. No. 08/023,243, illustrates a transmission gate (T-gate) coupled in series with the output port of a digital signal inverter in the signal path of the ring oscillator, thereby providing the capability to tune the frequency of the ring oscillator. Alternatively, it would be deskable to provide a tunable component in parallel or in shunt with the output port of such a digital signal inverter. The component may be employed to affect or vary the frequency of the ring oscillator, while, nonetheless, being removed from the path of the propagating signal. This configuration, thus, reduces the delay in the circuit attributable to having this frequency tuning capability.

Figure 2:
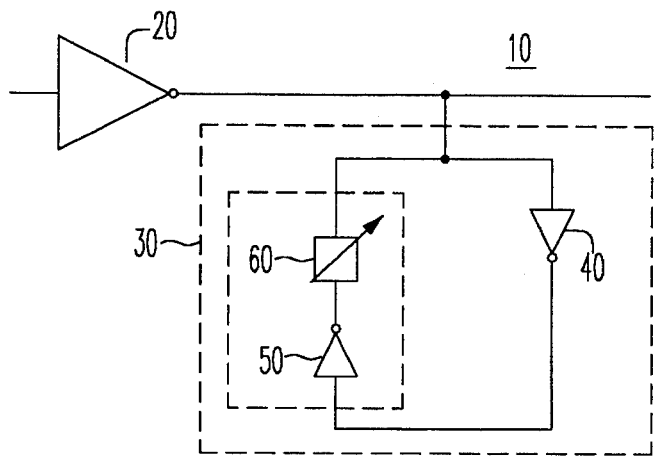
FIGS. 2, 3, and 4 are, respectively, circuit diagrams illustrating alternative embodiments of an electronically-controlled variable propagation delay digital signal inverter, such as may be incorporated in an electronically-controlled variable frequency ring oscillator in accordance with the invention.

A frequency tuning capability is provided by incorporating an embodiment of an electronically-controlled variable propagation delay digital signal inverter in accordance with the invention, such as embodiment 10 illustrated in FIG. 2, in a ring oscillator or, alternatively, in a delay line. As illustrated, a digital signal inverter 20, having an input signal port and an output signal port, has its output signal port coupled to an electronically-controlled negative resistance (ECNR) 30. In the context of the invention, the term "electronically-controlled negative resistance" or "electronically-controlled negative impedance" refers to a device or combination of devices that exhibits negative resistance or negative impedance characteristics, the resistance or impedance characteristics being controlled or adjusted by controlling or adjusting an electrical or electronic signal applied to the device or devices.

As will be explained in more detail hereinafter, ECNR 30 provides the capability to "tune" or vary the propagation delay of a conventional digital signal inverter 20. Thus, by employing electronically-controlled variable propagation delay digital signal inverter 10 in a ring oscillator, the oscillation frequency of the ring oscillator may be varied or controlled by an electrical or electronic signal. Furthermore, the electronically-controlled negative resistance (ECNR) is provided in parallel or in shunt with the output port of the signal inverter and, therefore, may be adjusted to introduce little or no additional delay in the signal path of the ring oscillator, as desired, so that the oscillator may achieve higher frequencies than may typically be achieved by other tunable or variable frequency ring oscillators.

As illustrated in FIG. 2, ECNR 30 includes an additional signal inverter 40, having its output port coupled to the input port of yet another digital signal inverter 50, having its output port coupled to a variable impedance 60. Variable impedance 60 couples the output port of inverter 50 to the output port of inverter 20. Furthermore, the input port of inverter 40 is likewise coupled to the output port of inverter 20. Assuming the gain of inverter 40 is $-A_2$ and the gain of inverter 50 is $-A_1$, and, likewise, assuming the impedance of variable impedance 60 is represented by Z, it may be demonstrated by a simplified small signal analysis that the impedance, $Z_{in}$, Of ECNR 30 is approximately provided by the following equation:

$$Z_{in} = \frac{Z}{1 - A_1 \times A_2} \quad [1]$$

Next, making the simplifying assumption that $A_1 \cdot A_2 = 1 + A_o$ provides the following equation:

$$Z_{in} = \frac{-Z}{A_o} \quad [2]$$

Thus, ECNR 30 realizes a negative impedance, which may be adjusted by varying Z, $A_1$, $A_2$ or any combination thereof. Nonetheless, the previous small signal analysis assumes that the output impedance of inverter 50, and inverter 40 in some situations, is negligible.

As illustrated in FIG. 2, the input port of inverter 40 is coupled to the output port of inverter 20. Thus, as explained in more detail hereinafter, adjusting, for instance, the impedance of variable impedance 60, which will adjust the negative resistance or impedance of ECNR 30, provides the capability to control how quickly the voltage signal at the output port of inverter 20 reaches the threshold voltage of inverter 40. Thus, in this manner, the propagation delay of inverter 10 is likewise capable of being controlled. Further advantages of providing an electronically-controlled negative impedance or resistance coupled to the output port of a conventional digital signal inverter will be explained in more detail hereinafter.

Figure 5:
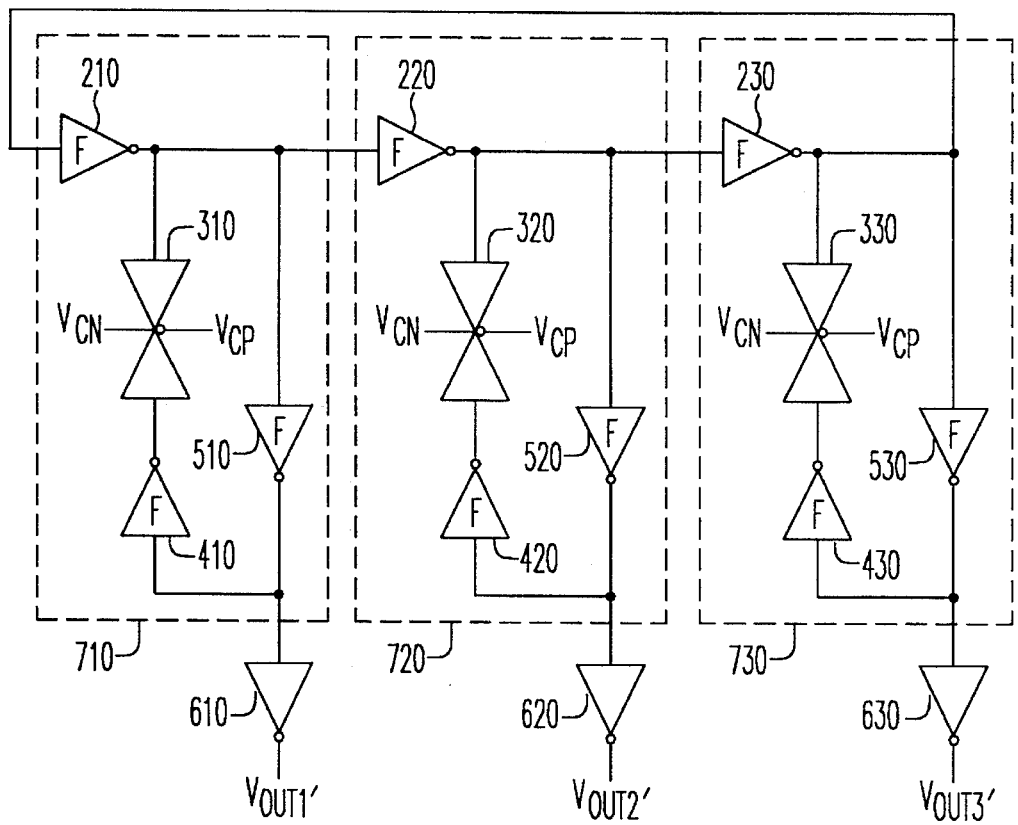
FIG. 5 is a circuit diagram of one embodiment of an electronically-controlled variable frequency ring oscillator in accordance with the invention.

FIG. 5 is a circuit diagram of an embodiment of an electronically-controlled variable frequency ring oscillator 120 in accordance with the invention that utilizes an electronically-controlled variable propagation delay digital signal inverter 710 of the type illustrated in FIG. 2. Nonetheless, in this particular embodiment, variable impedance 60 (FIG. 2) comprises a transmission gate (T-gate), such as T-gate 310 in FIG. 5, providing a voltage-controlled or voltage signal-controlled resistance. Thus, varying the resistance of the T-gate by adjusting the voltage signal applied to the T-gate, has the effect of varying the resistance of the ECNR, or in this instance the voltage signal-controlled negative resistance (VCNR).

In FIG. 5, electronically-controlled variable propagation delay digital signal inverter 710 is enclosed by dashed lines. Digital signal inverters 210, 410 and 510 in this particular embodiment may each comprise conventional CMOS inverters so that the ring oscillator may be incorporated in a CMOS IC. Electronically-controlled variable propagation delay digital signal inverters 720 and 730, also enclosed by dashed lines, are substantially similar to inverter 710. T-gates 320 and 330 correspond to T-gate 310, conventional inverters 530 and 520 correspond to inverter 510, and conventional inverters 430 and 420 correspond to inverter 410.

As previously suggested, T-gate 310 comprises a conventional T-gate, such as one having an N-channel MOSFET transistor and a P-channel MOSFET transistor with common or coupled transistor drains and sources (not shown). As illustrated in FIG. 5, the gates of the transistors of the T-gate receive respective control signals VCN and VCP, which control the conductivity of the corresponding transistors to effectively provide a voltage signal-controlled resistance. In the context of the invention, and well-known in the art, the signals VCN and VCP are complementary in that as the voltage VCN increases, the voltage VCP decreases. Thus, the conductivity of both the N-channel and P-channel transistors in the T-gate illustrated, gate 310, change substantially concurrently. Likewise, it is desirable that the conductivity of the N-channel transistor and the P-channel transistor be substantially the same. As the control signals, VCN and VCP, change or vary to affect the conductivity of the T-gate, the effective resistance coupled to the output port of inverter 20, is likewise varied. The effect of this change or variation in the resistance provided by T-gate 310, and, likewise, the other T-gates illustrated in FIG. 5, such as gates 320 and 330, is to adjust or vary the transition times of the digital signal appearing at the output port of the digital signal inverter, such as digital signal inverter 210, by affecting how quickly the threshold voltage of inverter 510 is reached, as previously suggested. Adjusting or varying the transition times of the digital signal will likewise result in a variation of the propagation delay of tunable inverters 710, 720 and 730, and, hence, of the frequency of the ring oscillator, thereby providing the desired frequency tuning capability.

Figure 6:
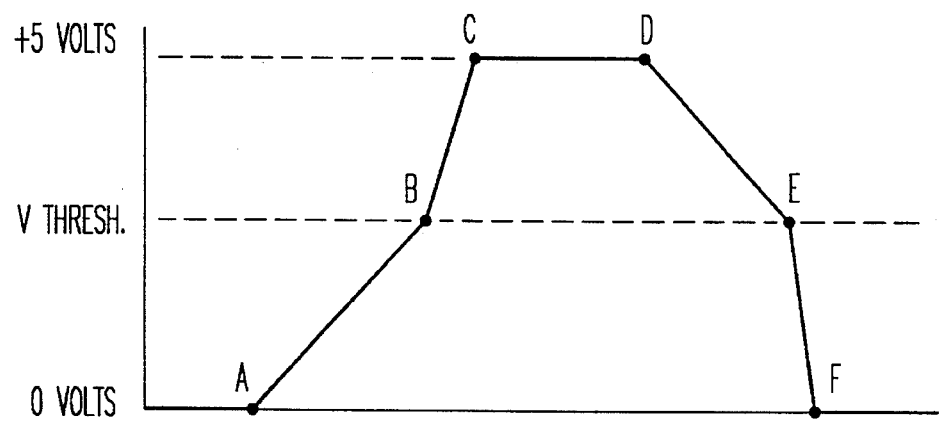
FIG. 6 is a diagram illustrating an idealized voltage output signal that may be produced by the embodiment of an electronically-controlled variable propagation delay digital signal inverter incorporated in the embodiment of an electronically-controlled variable frequency ring oscillator illustrated in FIG. 5.

FIG. 6 is an idealized representation of one duty cycle of the output voltage signal produced by embodiment 710 of an electronically-controlled variable propagation delay digital signal inverter in accordance with the invention. For the sake of convenience only, it will be assumed that the digital signal inverters, such as inverter 210, achieves a "high" voltage output signal of +5 volts and a "low" voltage output signal of 0 volts. The invention is not limited in scope to operation at these voltage output signal levels. Thus, in the portion of the diagram illustrated in FIG. 6 between points A and B, the voltage output signal of digital signal inverter 210 at its output port is rising or transitioning from 0 volts. During this signal transition or increase, the effect of T-gate 310 and likewise inverter 410 is to slow down the voltage signal transition or rise by diverting current through T-gate 310 to inverter 410, since the output port of inverter 410 is held "low" due to the "high" signal level maintained at its input port by inverter 510. Nonetheless, as the voltage signal at the output port of inverter 210 rises, eventually it reaches a threshold voltage, $V_{thres}$, representing the threshold voltage of inverter 510. Upon achieving this threshold voltage, inverter 510, previously having a "low" signal at its input port resulting in a "high" signal at its output port, switches the voltage levels at its output port and becomes a "low" signal. Thus, the input signal provided to the input port of inverter 510 is amplified by the gain of inverter 510. Likewise, after inverter 510 switches output signal levels, inverter 410, which has its input port coupled to the output port of inverter 510, is driven by the "low" signal at its input port resulting in a "high" signal at its output port. With this change in voltage signal levels, inverter 410 and T-gate 310, instead of opposing or slowing the rise in the level of the voltage signal at the output port of inverter 210 by sinking current, now source current, thus contributing to the rise in the voltage signal level at the output port of inverter 210, indicated in FIG. 6 by a more steep increase in the voltage signal level from points B to C in comparison with points A to B. As illustrated in FIG. 6, the opposite effect is achieved as inverter 210 attempts to transition or fall from a "high" voltage signal level of +5 volts to a "low" voltage signal level of 0 volts, illustrated in FIG. 6 by points D, E and F.

In this highly idealized description of operation, when inverter 510 switches output signal levels, as described, the output port of inverter 210 "sees" an effective negative resistance, thereby increasing how quickly the voltage signal level transition is achieved. Further, within a given cycle, the time at which the output voltage signal level reaches the threshold voltage, $V_{thres}$, is capable of being controlled by adjusting the control voltages or voltage signals of T-gate 310. Thus, by varying voltage signals VCN and VCP and, hence, using an electrical or electronic signal to control the effective resistance of T-gate 310, the propagation delay, and associated transition times illustrated in FIG. 6, may be adjusted as desired. When the control voltages are modified, the respective slopes, associated with lines A to B to C, and lines D to E to F in FIG. 6 are, likewise, adjusted. Furthermore, as previously suggested, this not only has the desirable effect of modifying the propagation delay of the inverter, but also providing the capability to tune the frequency of oscillation of ring oscillator 120 illustrated in FIG. 5. Reducing the propagation delay increases the frequency of the oscillator and extending the propagation delay slows or reduces the frequency of the oscillator.

One advantage of an electronically-controlled variable frequency ring oscillator in accordance with the invention that incorporates such an electronically-controlled variable propagation delay digital signal inverter is that the potential effect of noise, or "jitter," in the signal path of the ring oscillator is reduced. This reduction is accomplished by voltage signal level transitions B to C and E to F illustrated in FIG. 6, where the voltage signal transition occurs quickly, illustrated by the steep slope of the voltage signal or waveform. In this idealized representation of the output voltage signal, jitter is reduced by the presence of a negative resistance that drives the output voltage level away from the threshold voltage once the threshold voltage is achieved.

Another advantage provided by the embodiment of a ring oscillator in accordance with the invention, such as illustrated in FIG. 5, is that the control voltages or voltage signals for the T-gates, such as gates 310, 320 and 330, may be adjusted so that the T-gates provide an effective infinite resistance or an "open circuit." When the control voltages to accomplish this result are applied to the T-gates, ring oscillator 120 may be operated at a frequency high in comparison with other tunable ring oscillators, such as the ring oscillator in aforementioned U.S. patent application Ser. No. 08/023243 implemented with series elements at the output port of the inverters. Nonetheless, inverter 510 may have an effect on the frequency obtained and should be chosen carefully so that its effective capacitance is slight and does not unduly hinder the operation of the ring oscillator when T-gate 310 operates as an "open circuit."

Employing typical width-to-length transistor sizes of 40:1 or 16:1, such as may occur in 0.9 gm CMOS processing, ring oscillator 120 may have a frequency in the range of approximately 140 MHz to approximately 470 MHz, and may achieve an operating frequency of approximately 240 MHz. For a "fast" digital signal inverter, such as illustrated in FIG. 5 and designated "F," a resulting propagation delay of approximately 1 nanosecond may be achieved with a capacitive load of approximately 0.15 pF. It will be understood that these values regarding such digital signal inverters are provided solely for the purposes of illustration and the invention is not restricted in scope to inverters exhibiting these particular characteristics. Likewise, conventional inverters 610, 620 and 630 illustrated in FIG. 5 conveniently provide the output voltage signal of these variable propagation delay inverters, although these additional inverters are not essential for satisfactory operation.

Figure 3:
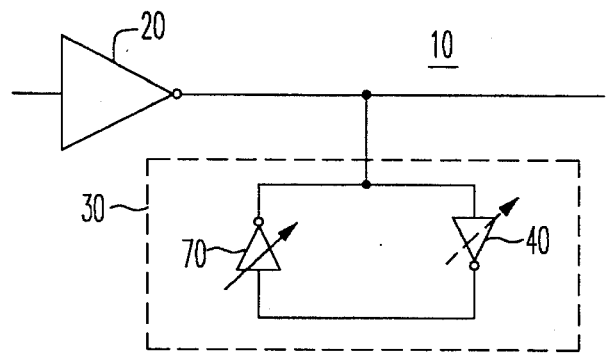
Figure 4:
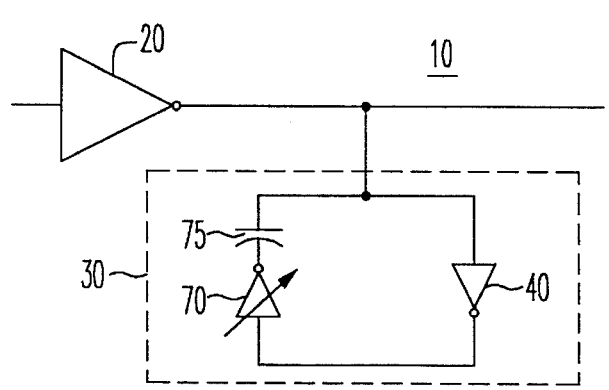

It will now be appreciated that alternative embodiments of an electronically-controlled negative resistance (ECNR) may be coupled to the output port of a digital signal inverter to provide either an electronically-controlled variable frequency ring oscillator or an electronically-controlled variable propagation delay digital signal inverter in accordance with the invention. For example, as illustrated in FIG. 3, electronically-controlled impedance 60 and inverter 50 may be combined into a single component 70. Component 70 may comprise a digital signal inverter whose output impedance or amplifier gain is tunable, thereby providing the capability to control or "tune" the magnitude of the negative resistance as well as the propagation delay of the digital signal inverter, as previously described. Alternatively, as illustrated in shadow in FIG. 3, component 40, instead of or in addition to component 70, may comprise such a variable or tunable digital signal inverter. Furthermore, component 70 or component 40, illustrated in FIG. 3, may comprise a current-starved inverter, thereby providing a current-controlled or current signal-controlled negative resistance or impedance (CCNR), instead of a voltage signal-controlled negative resistance or impedance. In this alternative embodiment, varying the current signal adjusting or controlling the inverter adjusts the impedance of the component and, likewise, the negative impedance of the current signal-controlled negative impedance. FIG. 4 illustrates yet another embodiment of an electronically-controlled variable propagation delay digital signal inverter in accordance with the invention. In this embodiment, a fixed capacitance, or capacitor, is coupled in series with component 70, comprising a variable or tunable gain digital signal inverter inverter as previously described. Again, varying the gain or impedance of component 70 by adjusting an electronic signal adjusts the negative impedance or resistance of ECNR 30 as well as the propagation delay of the digital signal. Likewise, other alternatives are possible, such as a variable inductive element or active components that likewise exhibit impedances that may be varied by an electrical or electronic signal, such as a voltage signal.

Figure 7:
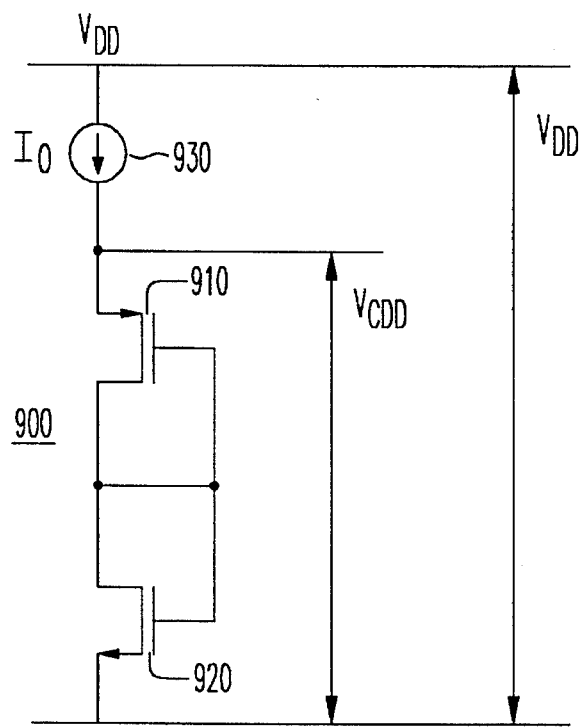
FIG. 7 is a circuit diagram of an embodiment of a compensating biased voltage source, such as may be employed to power an electronically-controlled variable propagation delay digital signal inverter in accordance with the invention incorporated in an electronically-controlled variable frequency ring oscillator in accordance with the invention.

Another aspect of an electronically-controlled variable propagation delay digital signal inverter in accordance with the invention is illustrated by the circuit diagram of an embodiment 900 of a compensating biased voltage source, such as illustrated in FIG. 7. Voltage source 900 is intended to compensate for various effects that may adversely affect the operation of a ring oscillator incorporated in an IC, such as a high operating temperature or IC fabrication anomalies. As illustrated, a conventional voltage source, VDD, is provided. Such a conventional voltage source may be provided to the digital signal inverters, such as those illustrated in FIG. 5 for ring oscillator 120. Nonetheless, several advantages are provided by alternatively employing the output voltage signal provided by a compensating voltage source, designated VCDD, as the voltage source of the digital signal inverters.

Typically, the "untuned" frequency of a ring oscillator may be affected adversely by the IC operating temperature or, alternatively, by processing anomalies occurring during the fabrication of the IC, such as, for example, failing to achieve the desired channel length for the transistors included in the digital signal inverters. The result of employing a configuration illustrated in FIG. 7 is to reduce these undesirable effects by powering or biasing the digital signal inverters in a manner that at least partially compensates or offsets these effects. As illustrated, a P-channel MOSFET 910 and an N-channel MOSFET 920 have their gates and drains coupled together. Likewise, a constant current source 930 provides a bias current, $I_o$, for this configuration of transistors. Transistors 910 and 920 are produced on the same IC as the digital signal inverters employed in the ring oscillator. Likewise, transistors 910 and 920 are fabricated to be either substantially identical or alternatively "matched" to the transistors included in the digital signal inverters. Thus, components 910 and 920 should have transistor characteristics, including anomalies, similar to those of the transistors included in the digital signal inverters. Where the transistors in the digital signal inverters of the ring oscillator are fabricated in such a way that may have an undesirable effect on the untuned oscillation frequency of the ring oscillator, transistors 910 and 920 are configured to provide a compensating biased voltage source that adjusts voltage VCDD to have an opposing, or offsetting, effect on the untuned frequency of the ring oscillator comprising these digital signal inverters.

This may be illustrated by an example. As is known in the art, if the temperature of the IC, which includes the digital signal inverters, rises, the untuned frequency of the ring oscillator will typically be reduced. This is due, at least partially, to a decrease in the transconductance inherent in the transistors of the digital signal inverters. Nonetheless, as suggested previously, VCDD will have an offsetting or compensating effect because raising the supply voltage source applied to the transistors has the effect of increasing the transconductance. In this instance, as the temperature of the IC increases, the inherent transconductance of the transistors on the IC decreases. Nonetheless, as these transconductances decrease, such as the transconductances of transistors 910 and 920, VCDD likewise increases due to the presence of constant current source 930, resulting in higher gate-to-source voltages in transistors 910 and 920. Because VCDD operates as the supply voltage source for the digital signal inverters of the ring oscillator, this increase in the supply voltage source VCAD has an offsetting or compensating effect on the untuned frequency of the ring oscillator, by at least partially cancelling or offsetting the effect of the increase in temperature on the transconductances of the transistors in the digital signal inverters. Furthermore, the desired oscillation frequency for the ring oscillator may be achieved by adjusting the electronically-controlled negative resistance (ECNR), as previously described.

Figure 8:
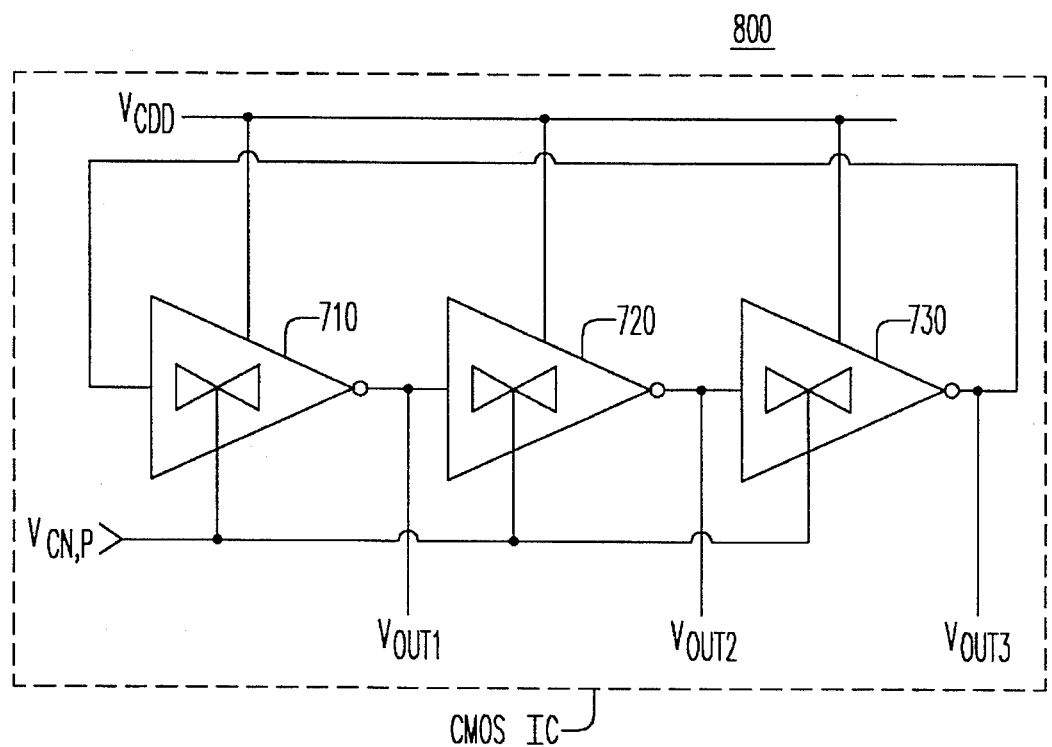
FIG. 8 is a schematic diagram of the embodiment of an electronically-controlled variable frequency ring oscillator illustrated in FIG. 5 employing the embodiment of a compensating biased voltage source illustrated in FIG. 7.

FIG. 8 illustrates a schematic diagram of an embodiment of an electronically-controlled variable frequency ring oscillator in accordance with the invention that includes an embodiment of a compensating biased voltage source. In FIG. 8, components 710, 720 and 730 correspond to the electronically-controlled variable propagation delay digital signal inverters illustrated in FIG. 5. Likewise, VCDD corresponds to the output voltage signal of the compensating voltage source illustrated in FIG. 7. Thus, by varying VCN and VCP, the frequency of the ring oscillator 800 illustrated in FIG. 8 may be tuned or varied, as desired.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

We claim:

1. An electronically-controlled variable propagation delay digital signal inverter comprising:

a digital signal inverter having an input signal port and an output signal port; and an electronically-controlled negative resistance (ECNR);

said ECNR being coupled to the output port of said inverter in a configuration so as to render the propagation delay of said digital signal inverter capable of being varied by varying the resistance of said ECNR.

2. The electronically-controlled variable propagation delay digital signal inverter of claim 1, wherein said ECNR comprises a voltage signal-controlled negative resistance (VCNR).

3. The electronically-controlled variable propagation delay digital signal inverter of claim 1, wherein said ECNR comprises a current signal-controlled negative resistance (CCNR).

4. The electronically-controlled variable propagation delay digital signal inverter of claim 1, wherein said digital signal inverter has a voltage source;

said voltage source comprising a compensating biased voltage source.

5. An electronically-controlled variable propagation delay digital signal inverter comprising:

a first digital signal inverter having an input signal port and an output signal port; and an electronically-controlled negative resistance (ECNR);

said ECNR being coupled to the output port of said first inverter;

said ECNR comprising:

a second and a third digital signal inverter, each having an input signal port and an output signal port; and a voltage signal-controlled variable impedance;

said second inverter having its output port coupled to the output port of said first inverter through said variable impedance;

said third inverter having its input port coupled to the output port of said first inverter and having its output port coupled to the input port of said second inverter.

6. The electronically-controlled variable propagation delay digital signal inverter of claim 5, wherein said voltage signal-controlled variable impedance comprises a transmission gate (T-gate).

7. The electronically-controlled variable propagation delay digital signal inverter of claim 6, wherein said first, second and third digital signal inverters each comprise a CMOS digital signal inverter;

said T-gate comprising a CMOS T-gate; and said electronically-controlled variable propagation delay digital signal inverter being incorporated within a CMOS integrated circuit.

8. An electronically-controlled variable frequency ring oscillator comprising:

2N+1 digital signal inverters, each of said 2N+1 inverters including an input signal port and an output signal port, N being a positive integer; and an electronically-controlled negative resistance (ECNR);

said 2N+1 inverters being coupled together serially in a ring oscillator configuration;

said ECNR being coupled to the output port of one of said 2N+1 inverters.

9. The electronically-controlled variable frequency ring oscillator of claim 8, wherein said ECNR comprises a voltage signal-controlled negative resistance (VCNR).

10. The electronically-controlled variable frequency ring oscillator of claim 9, wherein said VCNR comprises:

a first other digital signal inverter having an input signal port and an output signal port;

a second other digital signal inverter having an input signal port and an output signal port; and a voltage signal-controlled variable impedance;

said first other inverter having its output port coupled to the output port of said one of said 2N+1 inverters through said variable impedance;

said second other inverter having its input port coupled to the output port of said one of said 2N+1 inverters and having its output port coupled to the input port of said first other inverter.

11. The electronically-controlled variable frequency ring oscillator of claim 10, wherein said voltage signal-controlled variable impedance comprises a transmission gate (T-gate).

12. The electronically-controlled variable frequency ring oscillator of claim 11, wherein each of said 2N+1 inverters and said other inverters comprise a CMOS digital signal inverter;

said T-gate comprising a CMOS T-gate; and said electronically-controlled variable frequency ring oscillator being incorporated within a CMOS integrated circuit.

13. The electronically-controlled variable frequency ring oscillator of claim 8, wherein said ECNR comprises a current signal-controlled negative resistance (CCNR).

14. The electronically-controlled variable frequency ring oscillator of claim 8, wherein said one of said 2N+1 inverters has a voltage source, said voltage source comprising a compensating biased voltage source.

15. The electronically-controlled variable frequency ring oscillator of claim 8, wherein said one of said 2N+1 digital signal inverters comprises a first digital signal inverter;

said ECNR comprising:

a second digital signal inverter and a third digital signal inverter, each having an input signal port and an output signal port;

said second inverter having its output port coupled to the output port of said first inverter;

said third inverter having its input port coupled to the output port of said first inverter and having its output port coupled to the input port of said second inverter;

at least one of said second digital signal inverter and said third digital signal inverter having a variable impedance controlled by an electronic signal.

16. An electronically-controlled variable propagation delay digital signal inverter comprising:

at least three digital signal inverters, each of said three digital signal inverters including an input signal port and an output signal port; and, a transmission gate (T-gate);

the second of said three digital signal inverters having its output port coupled to the output port of the first of said digital signal inverters through said T-gate;

the third of said three digital signal inverters having its output port coupled to the input port of the second of said three digital signal inverters and having its input port coupled to the output port of the first of said three digital signal inverters.

17. A method of varying the frequency of a ring oscillator, said ring oscillator comprising a plurality of digital signal inverters coupled together serially in a ring oscillator configuration, said method comprising the steps of: coupling an electronically-controlled negative resistance (ECNR) to the output port of one of said inverters; and varying the electronic signal controlling said ECNR to adjust the resistance of said ECNR.

18. The method of claim 17, wherein said ECNR comprises a voltage signal-controlled negative resistance (VCNR);

the step of varying the electronic signal comprising varying the voltage signal controlling said VCNR to adjust the resistance of said VCNR.

19. The method of claim 17, wherein said ECNR comprises a current signal-controlled negative resistance (CCNR);

the step of varying the electronic signal comprising varying the current signal controlling said CCNR to adjust the resistance of said CCNR.

20. A method of varying the propagation delay of a digital signal inverter, said inverter including an input signal port and an output signal port, said method comprising the steps of:

coupling an electronically-controlled negative resistance (ECNR) to the output port of said inverter; and varying the resistance of said ECNR so as to adjust the propagation delay of said digital signal inverter.

21. The method of claim 20, wherein said ECNR comprises a voltage signal-controlled negative resistance (VCNR);

the step of varying the resistance comprising varying the voltage signal controlling said VCNR so as to adjust the resistance of said VCNR.

22. The method of claim 20, wherein said ECNR comprises a current signal-controlled negative resistance (CCNR);

the step of varying the resistance comprising varying the current signal controlling said CCNR so as to adjust the resistance of said CCNR.

23. An electronically-controlled variable propagation delay digital signal inverter comprising: a first digital signal inverter having an input port and an output port; and an electronically-controlled negative resistance (ECNR);

said ECNR being coupled to the output port of said first inverter;

said ECNR comprising:

a second digital signal inverter and a third digital signal inverter, each having an input signal port and an output signal port;

said second inverter having its output port coupled to the output port of said first inverter;

said third inverter having its input port coupled to the output port of said first inverter and having its output port coupled to the input port of said second inverter;

at least one of said second digital signal inverter and said third digital signal inverter having a variable impedance controlled by an electronic signal.

* * * * *